(12) United States Patent
Naskali

(10) Patent No.: US 11,397,213 B2
(45) Date of Patent: Jul. 26, 2022

(54) METHOD, CONTROLLING UNIT AND ELECTRONIC CHARGING ARRANGEMENT FOR DETERMINING STATE OF CHARGE OF A BATTERY DURING CHARGING OF THE BATTERY

(71) Applicant: TESPACK OY, Helsinki (FI)

(72) Inventor: Matti Naskali, Valencia (FI)

(73) Assignee: TESPACK OY, Helsinki (FI)

( * ) Notice: Subject to any disclaimer, the term of this patent is extended or adjusted under 35 U.S.C. 154(b) by 107 days.

(21) Appl. No.: 16/558,245

(22) Filed: Sep. 2, 2019

(65) Prior Publication Data

US 2019/0383880 A1 Dec. 19, 2019

Related U.S. Application Data

(63) Continuation of application No. PCT/FI2018/050154, filed on Mar. 2, 2018.

(30) Foreign Application Priority Data

Mar. 2, 2017 (FI) ...................................... 20175193

(51) Int. Cl.
  *G01R 31/3835* (2019.01)
  *H01M 10/44* (2006.01)
(52) U.S. Cl.
  CPC ........ *G01R 31/3835* (2019.01); *H01M 10/44* (2013.01)
(58) Field of Classification Search
  None
  See application file for complete search history.

(56) References Cited

U.S. PATENT DOCUMENTS

| 5,905,364 A | 5/1999 | Ookita |
| 6,127,810 A * | 10/2000 | Sato ...................... H02J 7/0086 |
| | | 320/148 |
| 2005/0264263 A1 | 12/2005 | Tsenter |
| 2009/0184685 A1 | 7/2009 | Sim et al. |
| 2012/0200266 A1 | 8/2012 | Berkowitz et al. |
| 2014/0145684 A1 | 5/2014 | Liu et al. |

(Continued)

FOREIGN PATENT DOCUMENTS

| JP | 2003291752 A * | 10/2003 | ............. B60R 16/02 |
| JP | 201726258 A * | 2/2017 | ............... F23Q 3/00 |

OTHER PUBLICATIONS

WIPO, International Search Report in corresponding PCT application PCT/FI2018/050154, dated Jun. 14, 2018.

(Continued)

*Primary Examiner* — Roy Y Yi
(74) *Attorney, Agent, or Firm* — Ryan Alley IP

(57) ABSTRACT

A method, a controlling unit and an electronic charging arrangement for determining a state of charge of a battery (205) during charging of the battery (205) are presented. The method comprises charging (110) the battery (205) with a charging current (410) during a first time period (T1), interrupting (120) the charging current (410) after the first time period (T1) at least for an interruption time period (T2), determining (130) a change (480) of terminal voltage (420) of the battery (205) during the interruption time period (T2), and determining (140) the state of charge based on the determined change (480) of terminal voltage (420).

10 Claims, 5 Drawing Sheets

(56) References Cited

U.S. PATENT DOCUMENTS

2015/0028819 A1     1/2015  Yeu et al.
2015/0349547 A1*    12/2015 Jeon ..................... H02J 7/0047
                                                        320/134

OTHER PUBLICATIONS

WIPO, Written Opinion of the ISA in corresponding PCT application PCT/FI2018/050154, dated Jun. 14, 2018.

* cited by examiner

METHOD, CONTROLLING UNIT AND ELECTRONIC CHARGING ARRANGEMENT FOR DETERMINING STATE OF CHARGE OF A BATTERY DURING CHARGING OF THE BATTERY

RELATED APPLICATIONS

This application claims priority under 35 U.S.C. § 120 to, and is a continuation of, co-pending International Application PCT/FI2018/050154, filed Mar. 2, 2018 and designating the US, which claims priority to FI Application 20175193, filed Mar. 2, 2017, such FI Application also being claimed priority to under 35 U.S.C. § 119. These FI and International applications are incorporated by reference herein in their entireties.

BACKGROUND

Technical Field

The invention concerns in general the technical field of charging of electrical energy storages. The invention concerns especially, however, not exclusively, determining state of charge of a battery during charging of the battery.

Charging a battery is a slow process compared to storing energy notorious other types of energy storages, for example, when fueling a car. The amount of energy stored per unit of time, that is, charging power, is typically much lower in case of electrical charging compared to various other techniques.

Most common method to charge a battery is so called constant-current-constant-voltage method. According to this method, the charging current lower or equivalent to the maximum allowed charging current of the battery is fed being through the terminals of the battery, and in the final state a constant voltage is applied on battery terminals while the current continues to reduce until it becomes low enough to determine that the battery is fully charged.

The constant-current-constant-voltage method is applied especially in charging of lithium cobalt oxide ($LiCoO_2$) batteries, which are very critical on the constant voltage accuracy as these batteries are capable of absorbing more charge than their specified capacities if over charged with higher than the specified voltage. Overcharging these batteries increases their volatility and probability to fail. Some other characteristics of these batteries with respect to the volatility, for example an internal impedance, however, remain essentially the same in $LiCoO_2$ batteries even when overcharged. Some lithium-ion (Li-ion) batteries that are often used in high power applications like electric cars and power grid load balancing, for example lithium magmanese oxide (LiMnO), lithium metatitanate ($Li_2TiO_3$) and lithium iron phosphate ($LiFePO_4$) batteries, differ from $LiCoO_2$ battery in a way they function, that is, they have no capacity to accommodate more charge than their specified capacity and are thus less sensitive to the charging voltage.

Some earlier attempts have been made in order to shorten the charging times of batteries. These relate to estimating the battery open-circuit voltage while the battery circuit is not physically open, but the charging is in progress in the first phase using a constant current, or at least close to a constant current, that is, during "constant current mode". The charging current is then driven to zero or to even negative values for a period of time during which the magnitude of the open-circuit voltage may be measured and compared to the estimated open-circuit voltage. The performance of the above-described methods is very susceptible with respect to the accuracy of the estimated open-circuit voltage for the particular battery affected by the charging current, temperature, battery size, and of course on the number of cells, i.e. battery internal resistances and design voltages.

There is still a need for developing methods for determining the state of charge of batteries during charging in order to facilitate quicker and accurate charging.

SUMMARY

An objective of the present invention is to present a method, a controlling unit and an electronic charging arrangement for determining the state of charge of a battery during charging of the battery. Another objective of the present invention is that the method, the controlling unit and the electronic charging arrangement avoids the use of constant-voltage mode of charging and reduces the time for the current to reduce until it becomes low enough to determine the fully charged condition, therefore, facilitating quick and accurate charging of batteries.

The objectives of the present invention are reached by a method, a controlling unit and an electronic charging arrangement as defined by the respective independent claims.

According to a first aspect, a method for determining a state of charge of a battery during charging of the battery is provided. The method comprises:
  charging the battery with a charging current during a first time period,
  interrupting the charging current after the first time period at least for an interruption time period,
  determining a change of terminal voltage of the battery during the interruption time period, and
  determining the state of charge based on the determined change of terminal voltage.

The charging may comprise charging the battery with a constant current.

The interrupting may comprise interrupting the charging current by opening a switch through which the charging current is injected into the battery via battery terminals for providing an open-circuit condition for the battery. The switch may be a semiconductor switch or a mechanical switch.

The method may comprise a delay time period after the first time period prior to the determining of the change of the terminal voltage for the charging current to diminish.

The determining of the change of terminal voltage may comprises measuring the terminal voltage at two time instances during the interruption time period, and determining the difference between the measured voltage values.

The determining of the state of charge comprises comparing the determined change of the terminal voltage to a threshold value for the change of terminal voltage.

The method may comprise determining a third voltage value in the end of the first time period or in the beginning of the interruption time period to be utilized as a reference value for determining fully charged condition of the battery.

According to a second aspect, a controlling unit for determining a state-of-charge of a battery during charging is provided. The controlling unit comprises
  at least one processor, and
  at least one memory storing at least one portion of computer program code,
wherein the at least one processor is configured to cause the controlling unit at least to perform to:

charge the battery with a charging current during a first time period, interrupt the charging current after the first time period at least for an interruption time period, determine a change of terminal voltage of the battery during the interruption time period, and determine the state of charge based on the determined change of terminal voltage.

According to a third aspect, an electronic charging arrangement for determining a state-of-charge of a battery during charging is provided. The electronic charging arrangement comprises charging means for charging the battery, wherein the charging means are electrically connected to battery terminals of the battery, determining means for determining a terminal voltage of the battery, and a controlling unit configured at least to:

charge the battery with a charging current during a first time period, interrupt the charging current after the first time period at least for an interruption time period, determine a change of terminal voltage of the battery during the interruption time period, and determine the state of charge based on the determined change (480) of terminal voltage; and wherein the controlling unit and the determining means are at least communicatively connected to each other.

The controlling unit and the switch or the charging means may be at least communicatively connected to each other.

The present invention provides advantages such as by facilitating quicker and accurate charging of batteries which does not rely on the estimation of the open-circuit voltage of the battery. The methods, controlling units and electronic arrangement according to various embodiments of the present invention may be utilized in various applications requiring charging electrical batteries, such as, mobile terminal devices, automobiles, electric bikes or motorcycles, home appliances, etc.

The terms "first", "second" and "third" do not denote any order, quantity, or importance, but rather are used to distinguish one element from another.

The exemplary embodiments of the present invention presented herein are not to be interpreted to pose limitations to the applicability of the appended claims. The verb "to comprise" is used herein as an open limitation that does not exclude the existence of also un-recited features. The features recited in depending claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

The embodiments of the present invention are illustrated by way of example, however, not by way of limitation, in the figures of the accompanying drawings which are briefly described in the following.

DETAILED DESCRIPTION OF SOME EMBODIMENTS

Figure 1:
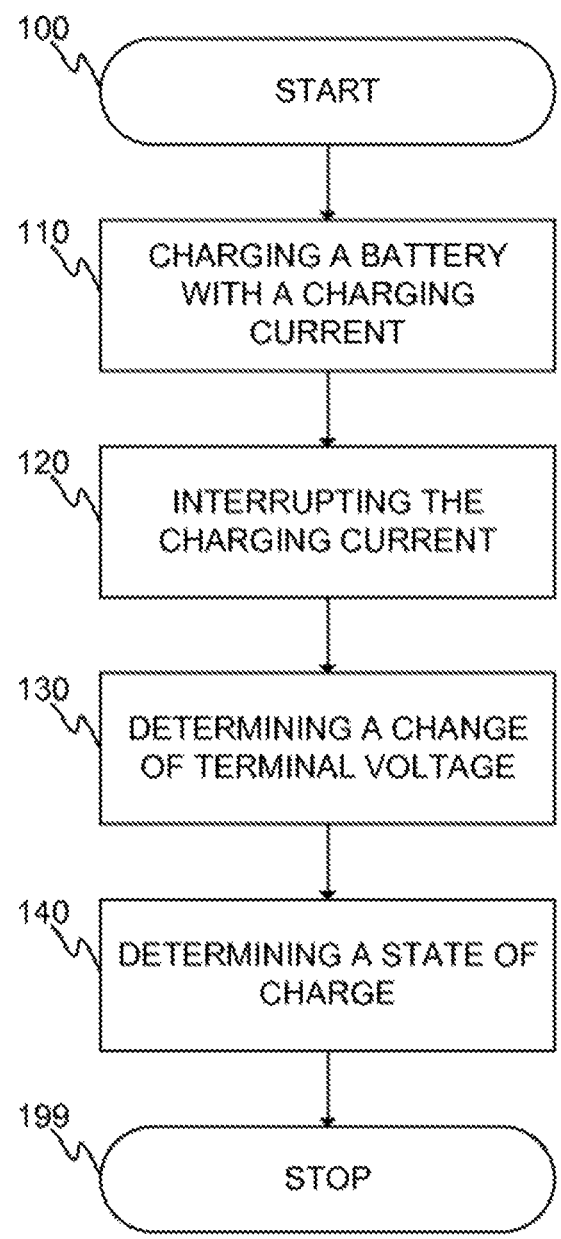
FIG. 1 illustrates a flow diagram of a method according to an embodiment of the present invention.

FIG. 1 illustrates a flow diagram of a method according to an embodiment of the present invention. At 100, referring to a start-up phase, the necessary hardware, such as a battery, measuring means for measuring voltages, electrical converter or converters for charging, electrical energy storages or means for producing electrical power, conductors and other necessary electronics, computing units, etc., and software, may be obtained and configured for operation. Specific care must be taken that the individual elements and units work together in communication with each other, if necessary.

At 110, charging the battery with a charging current during a first time period may take place.

Concerning step 110, the charging current may preferably be direct current (DC) which may be substantially constant or may vary during the first time period. The first time period may essentially be anything from very short to very long period of time. However, the first time period should be configured to last at least for some charge to able to be stored into the battery. On the other hand, the first time period shouldn't be so long that the battery will become overcharged before the state of charge of the battery is determined. The length of the first time period may be, for example, in the range from 0.1 to 60 seconds, preferably from 2.0 to 10 seconds and most preferably from 3.0 to 6.0 seconds.

In cases when the method according to an embodiment of the present invention is being repeated many times in a row or in subsequent time periods (between which there may or may not be periods of not performing the method) during charging of the battery, the length of the first time periods may be con-figured to vary with respect to each other, for example, so that when the state of charge is approaching the fully charged condition, the length of the first time period is configured to shorten. During low charge conditions the first time period may be, for example, 10 or even 60 seconds, and once the battery is nearly fully charged, the first time period may be changed so that it is configured to be, for example, 2.0 to 6.0 seconds. This is further illustrated in FIG. 7 which is described hereinlater more in detail.

At 120, interrupting the charging current after the first time period at least for an interruption time period may take place.

The charging current may be interrupted, for example, by a switch, such as a semiconductor switch or a mechanical switch. The interruption of the charging current as defined herein entails providing at least momentarily, that is at least for the first time period, an electrical open-circuit condition for the battery under charging. The open-circuit condition may, therefore, not need to be a physical open-circuit as is the case when utilizing a semiconductor switch.

The interruption time period may, preferably, configured to be such that the terminal voltage of the battery has had enough time to go through the rapid transient caused by a voltage component caused by the charging current over a resistance of the battery. This is further explained with respect to FIGS. 4 and 5A-5C. In addition, the interruption time period should be configured to be at least long enough for the charging current actually drop to zero, the change of current which is affected, that is slowed down, by any inductances in the charging circuit or the battery. The interruption time period may be, for exam-pie, from 0.1 to 5.0 seconds, preferably from 2.0 to 3.0, or 2.0 to 4.0 seconds.

In cases when the method according to an embodiment of the present invention is being repeated many times in a row or in subsequent time periods (between which there may or may not be periods of not performing the method) during charging of the battery, the length of the interruption time periods may be configured to vary with respect to each other, for example, so that when the state of charge is approaching the fully charged condition, the length of the interruption time period is configured to shorten. During low charge conditions the interruption time period may be, for example, 4.0 to 5.0 seconds, and once the battery is nearly fully charged, the interruption time period may be changed so that it is configured to be, for example, 1.0 to 2.0 seconds. This is further illustrated in FIG. 7 which is described hereinlater more in detail.

There may be a delay time period after the first time period prior to step 130 in order to wait the charging current to diminish before determining the change in terminal voltage. The charging circuit may include inductive components which, as is known, slows down or "opposes" the change of current due to Lenz's law. This may be beneficial in order for the transient not the affect the accuracy of the determination of the change of terminal voltage at step 130.

According to an embodiment of the present invention, a third voltage value determined in the end of the first time period or in the beginning of the interruption time period, that is right after the first time period, may be utilized as a reference value for determining fully charged condition of the battery. The utilization of the third voltage value is described in more detail hereinlater with respect to FIGS. 6A and 7.

At 130, determining a change of terminal voltage of the battery during the interruption time period may take place.

The determination of the change of terminal voltage may be implemented, for example, by a voltage measurement sensor coupled to the battery terminals, or by the electrical converter providing the charging current typically comprising means for voltage measurement. Other known methods for determining voltage may also be used. The change of the terminal voltage may, preferably, be performed by measuring the terminal voltage at least twice during the interruption time period, and then determining the difference between the voltage values of the two measurements relative to the time between the measurements.

At 140, determining the state of charge based on the determined change of terminal voltage may take place.

The determination of the state of charge may be implemented by comparing the determined change of terminal voltage to a threshold value for the change of terminal voltage. In practice, this means comparing the slope of the change of terminal voltage to the threshold value for the slope.

At 199, the method execution may be stopped or ended. The method may be executed once, intermittently or, preferably, continuously in order to monitor the state of charge of the battery during charging. The method may be executed at least as long as the battery becomes fully charged, that is, until the full charge condition is detected.

Figure 2:
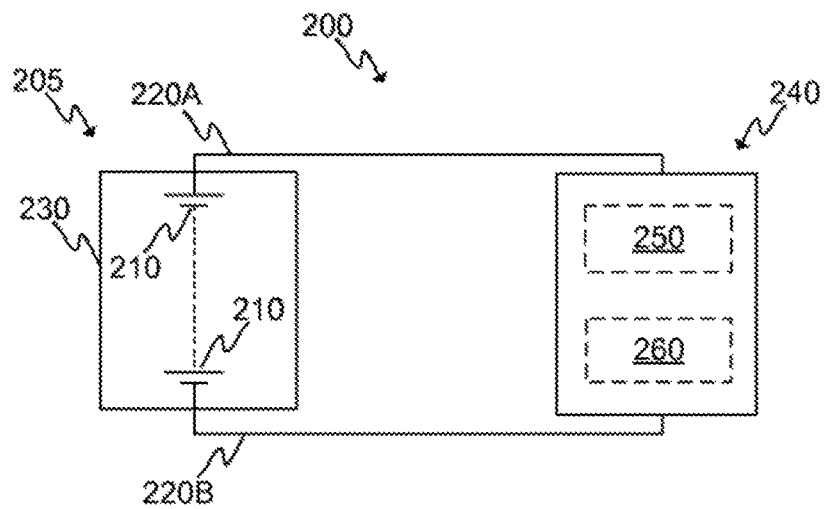
FIG. 2 illustrates schematically an electronic charging arrangement according to an embodiment of the present invention.

FIG. 2 illustrates schematically an electronic charging arrangement 200 according to an embodiment of the present invention. The battery 205 under charging conditions may comprise several battery units 210 connected in series or in parallel within the body 230 or the enclosure 230 of the battery 205. According to some embodiments, several batteries 205, preferably having similar or substantially identical characteristics, may also be connected in series or in parallel.

In FIG. 2, the battery 205 is connected in parallel with charging means 240 for charging the battery 205, for example, a charging device 240, such as, an electrical converter 240. The electrical converter 240 may be any suitable converter converting currents and voltages at its input terminal to direct current (DC) and DC voltage values at its output for charging the battery 205 or batteries 205. The converter 240 may be unidirectional or bidirectional converter capable of charging and/or discharging the battery 205. The open-circuit voltage of the battery 205 may be determined by measuring voltage between the electrical connectors 220A and 220B. The current flow through these connectors is the charging or discharging current of the battery 205. Furthermore, the charging means 240 may comprise a controlling unit 250 for determining a state-of-charge of a battery during charging. The charging means 240 may be configured to execute the method according to an embodiment of the present invention, such as, illustrated in and described in connection with FIG. 1. The charging means 240 may also, as described already hereinearlier, comprise determining means 260, such as a voltage measurement device, for determining the open-circuit voltage of the battery 205.

Figure 3:
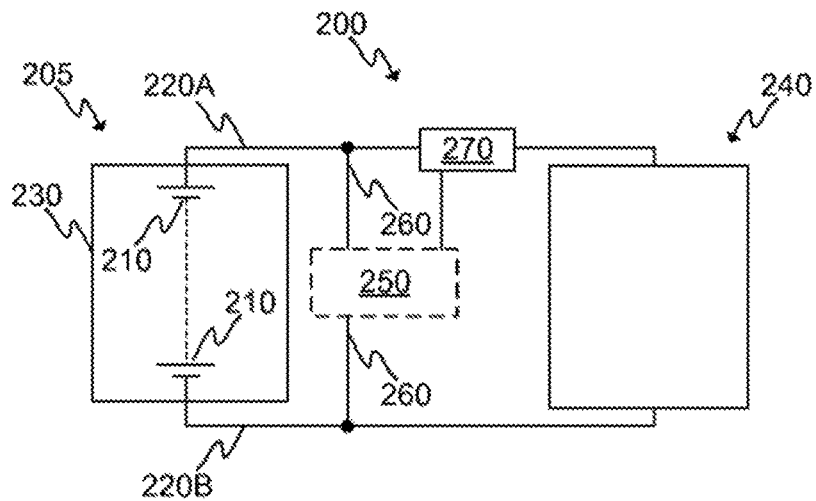
FIG. 3 illustrates schematically an electronic charging arrangement according to an embodiment of the present invention.

FIG. 3 illustrates schematically an electronic charging arrangement according to an embodiment of the present invention. The battery 205 may be connected in parallel with charging means 240, however, the electronic charging arrangement 200 comprises separate components for implementing the method according to an embodiment of the present invention, such as, separate control unit 250, voltage detection means 260, and a switch 270 for causing the battery 205 to be in open-circuit condition.

Figure 4:
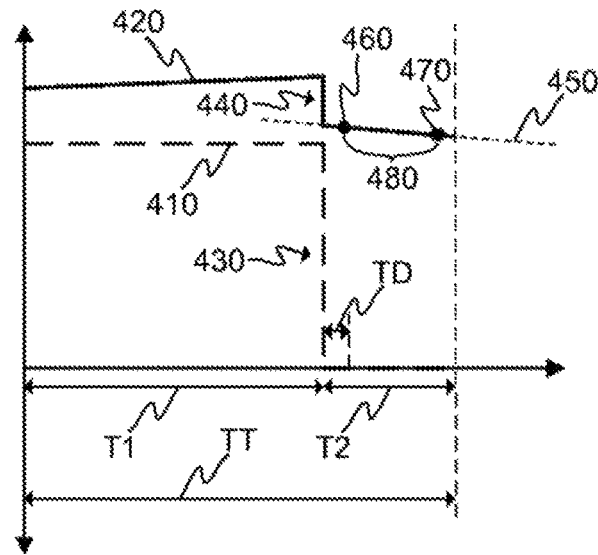
FIG. 4 illustrates schematically determination of the state of charge of a battery according to an embodiment of the present invention.

FIG. 4 illustrates schematically determination of the state of charge of a battery according to an embodiment of the present invention. Vertical axis represents charging current 410 marked with a dashed line and battery voltage 420 marked with a solid line. Horizontal axis represents time. The battery 205 is being charged with the charging current 410 during the first time period T1. After the first time period T1, the charging current 410 is being interrupted, and thus drops to zero. The charging current 410 remains negligible during an interruption time period T2. The total time period TT includes both the first time period T1 and the interruption time period T2, therefore, defining one charging period TT during which at least steps of charging the battery with a charging current during a first time period T1, interrupting the charging current after the first time period T1 at least for an interruption time period T2, and determining a change of terminal voltage of the battery during the interruption time period T2 are per-formed. The step related to determining the state of charge based on the determined change of terminal voltage may also take place during the charging time period TT, preferably during the interruption time period T2. According to an embodiment of the present invention, at least step 110-130 illustrated in and described related to FIG. 1 may take place during the charging period TT. Also step 140 of FIG. 1 may take place during the interruption time period T2.

The interruption of the charging current 410 causes the charging current to reduce to zero as shown in FIG. 4 at 430. The slope of the charging current 410 at 430 may be affected by, for example, inductive components through which the charging current 410 flows. Although shown in FIG. 4 as an abrupt change of current, in practice the change may not be a step-like change but rather have a finite value for its slope. In FIG. 4, the change has been illustrated as abrupt for simplicity.

As the charging current 410 diminishes, the battery voltage 420 also goes through a change. This is illustrated in FIG. 4 at 440. This is mainly due to a voltage drop occurring in resistive elements through which the charging current 440 flows. This is described in more detail with respect to FIGS. 5A-5C, which illustrates various circuit models of battery.

There may also be a delay time period TD after the first time period T1 for waiting before determining the change of battery voltage 420 in order for the current 410 to diminish to zero and/or to wait that transient related to the abrupt change of current 430 and/or voltage 440 have had time to disappear or at least to be attenuated.

During the interruption period T2, optionally after the delay time period TD, the battery voltage 420 exhibits a slope 450 during a relatively short period, at least a part of which is visible during the interruption time period T2 in FIG. 4. The reason for this is described hereinlater with respect to FIGS. 5A-5C. According to an embodiment of the present invention, the value of the slope 450 may be determined by determining instantaneous battery voltages, for exam-pie by measuring, at least at two time instances, namely, at the first 460 and the second 470 time instances. The slope 450 may then be determined by a ratio of the change of voltage 480 between the determined instantaneous battery voltages to the time period between the determinations of the voltages at said two time instances. The ratio may also be a reciprocal of said ratio. Although the battery voltage 420 is determined only at two time instances in FIG. 4, it is to be understood that said voltage may be determined at more than two time instances during at least the interruption time period T2. The slope 450 may then be determined, for example, by first calculating average value or values based on certain amount of determined voltage values, and then the aver-ages may be used to determine the value of the slope 450. Other mathematical methods known to a skilled person may also be used for determining the value of the slope 450.

Figure 5A:
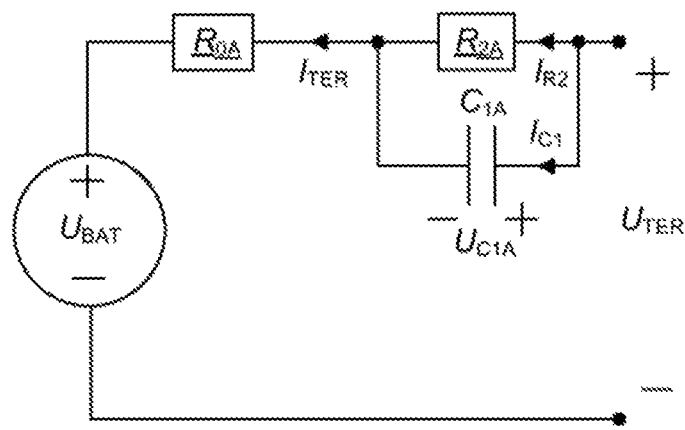
FIGS. 5A-5C illustrate schematically various known circuit models for a battery.
Figure 5B:
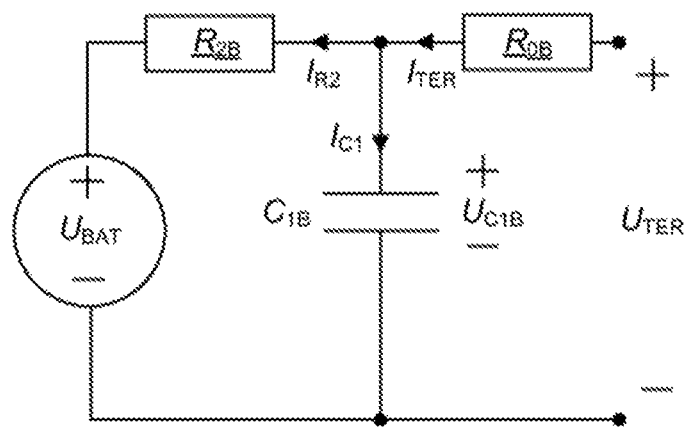
Figure 5C:
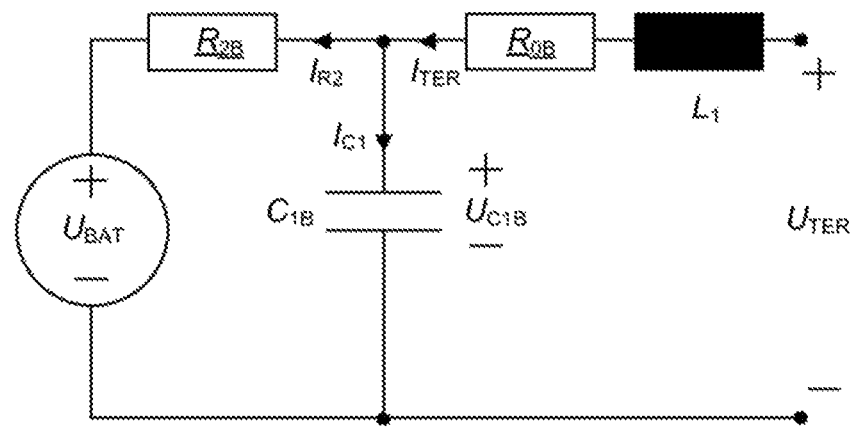

FIGS. 5A-5C illustrate schematically various known circuit models for a battery 205. L/BAT represents the voltage generated by the battery unit or units inside the battery 205. This is not readily measurable, however, it may be measured or at least estimated by a measurement of the battery open-circuit voltage, that is, when no charging current is being injected to the battery 205. During charging, all the components through which the current flows affect the measured battery terminal voltage L/TER. Various resistive elements of the battery 205 may be represented by resistive components, such as first ROA, ROB and second R2A, R2B resistive elements of the circuit diagrams. It should be noted that these components are not electronic components as such but merely represent resistivity within the battery and conductors comprised in it. The abrupt change 440 in battery voltage 420 relates to voltage drop over ROA or ROB, depending on the circuit diagram used, once the charging current 410 is interrupted. As shown in FIG. 5C, there may, however, be inductive elements Li, through which the charging current flows, thus opposing the sudden change 430 of charging current 410. This then also affects the slope of the change 440 of battery voltage 420. The second current 2 through the second resistive element R2A, R2B, the first current/TER through the first resistive element ROA, ROB, and the current/ci through the capacitive element CIA, CIB are shown with arrows in the diagrams indicating the direction of the currents.

Battery circuit diagrams typically also comprise capacitive element, such as, CIA and CIB. The voltage over the capacitive element L/CIA, L/CIB are shown in FIGS. 5A-5C indicating the polarity of the voltage. Said capacitors represent or model the response to the easiest moving ions in a battery 205. When charging current is interrupted, for example, the easiest moving ions return to the lower voltage level of the battery either by exchanging electrons with other ions inside the battery, or in case of discharging, may exchange electrons with external circuit. In both cases the voltage drifts slowly down as is illustrated in and described with respect to FIG. 4. This drift, and the slope 450 it produces, is related to the capacitance CIA or CIB.

The characteristics of the charging current 410 and the battery voltage 420, and the changes related to thereof, are described herein with respect to the circuit diagram illustrated in FIG. 5B. Similar description may also be provided with respect to each of the circuit diagrams in FIGS. 5A and 5C.

During the first time period T1, the charging current 410 flows into the battery due to the fact that the terminal voltage L/TER is higher than the voltage L/BAT produced by the battery unit(s) 210 comprised in the battery 205. The charging current flows through the first resistive element ROB of FIG. 5B. If considering a constant charging current 410 for the sake of simplicity, the voltage L/CIB of the capacitive element CIB settles to a value L/CIB=L/TER−/TERROB. Furthermore, as at least part of the charging current 410 flows also through the second resistive element R2B, the voltage of the L/CIB of the capacitive element CIB must also satisfy the equation L/CIB=L/BAT+/R2R2B, that is, being at higher voltage level with respect to L/BAT. When the charging current 410 is interrupted after the first time period T1 and the battery is provided with an open-circuit condition, the battery terminal voltage L/TER drops abruptly due to a voltage drop over the first resistive element ROB. After this, and partly already during it, the capacitive element CIB having a higher voltage level L/CIB with respect to L/BAT, starts to discharge itself into the battery unit(s) 210 through the second resistive element R2B. As the capacitive element CIB discharges, its voltage L/CIB starts to decrease and approach L/BAT. This causes the slope 450 to the battery terminal voltage 420 measurable and detectable by measuring the terminal voltage during the interruption time period T2 at least at two time instances 460, 470. Based on this, it is clear that the interruption time period T2 and/or the delay time period TD should not last too long before the change in the terminal voltage is determined in order for the slope 450 not to disappear. It should be noted, however, that FIG. 5B merely illustrate one type of a circuit diagram of battery. In case of the circuit diagram in FIG. 5A, the slope 450 is due to discharging of the capacitive element CIA through the second resistive element/¾A, and the change of voltage 440 due to the voltage drop over the first resistive element ROA.

Figure 6A:
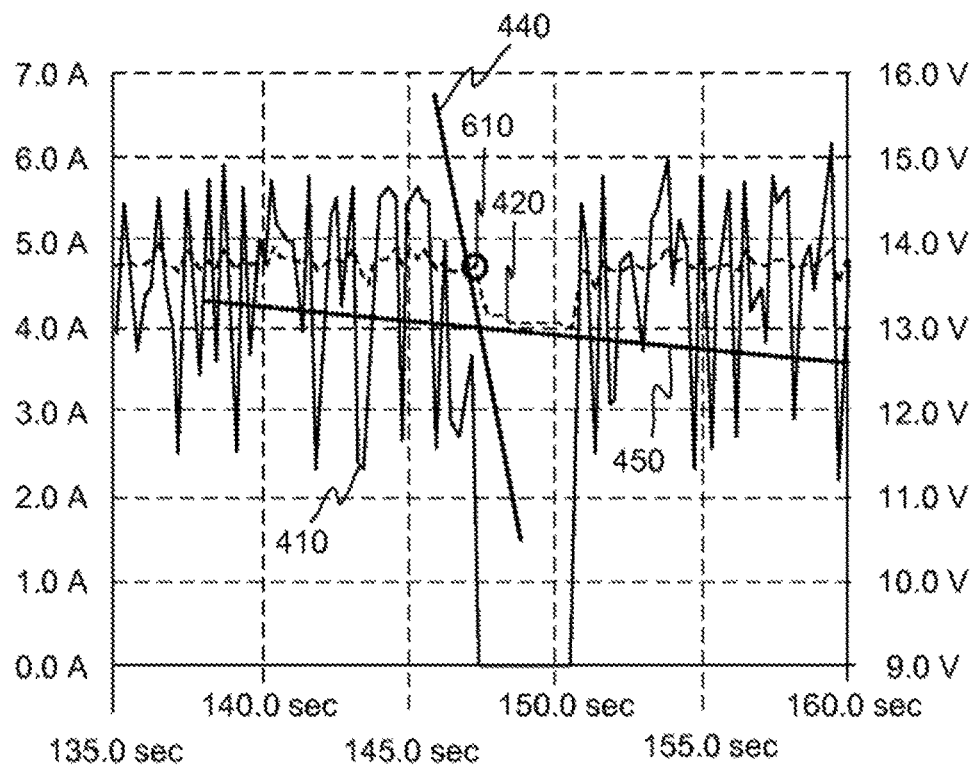
FIGS. 6A and 6B illustrates determination of the state of charge of a battery according to an embodiment of the present invention.
Figure 6B:
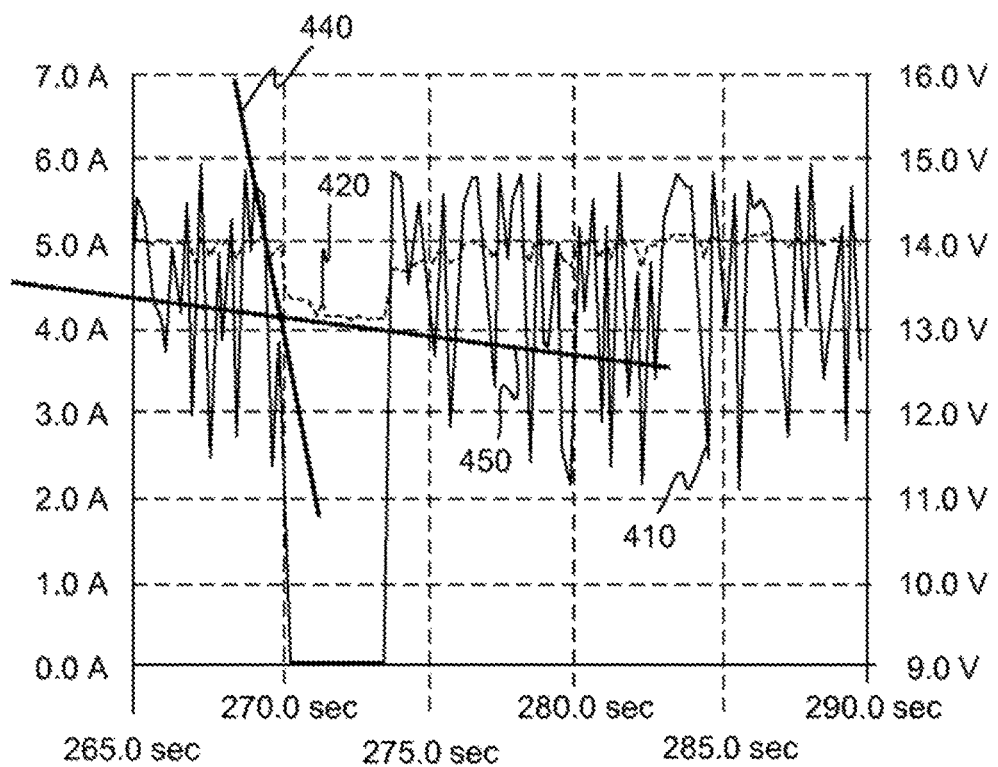

FIGS. 6A and 6B illustrates measured charging current 410 and battery terminal voltage 420 during charging TT, and illustrates the determination of the state of charge of a battery according to an embodiment of the present invention. The value of the charging current 410 is shown at the vertical axis on the left and the value of the battery terminal voltage 420 at the vertical axis on the right. The slope 450 of the battery terminal voltage 420 is clearly visible, however, still further emphasized by the straight line 450. The instant voltage drop in FIG. 4 looks slanted due to low sampling frequency. The actual voltage drop 440 is more abrupt than the used sample frequency could reveal. The voltage drift or slope 450 related to CIA or CIB is approximated with the straight line 450. During the interruption time period, the voltage clearly, however, slowly reduces. Thought there are several samples taken during the interruption time period, used period does not show much reduction during the current interruption. The abrupt voltage drop 440 which is related to resistive element(s) of the battery and a part of the electrical arrangement for charging, and the slower voltage drop, that is, the slope 450 related to capacitive element(s) of the battery makes the method according to the various embodiments of the present invention to detect those to values robust and easy.

According to an embodiment of the present invention, the electronic charging arrangement and, particularly, the controlling unit thereof, monitors the battery terminal voltage 420 and calculates the value of the slope 450 continuously. Once it determines, after the first time period T1, that the slope 450 has reach more stable value, that is, after the abrupt change 440, the controlling unit may start the determination of the state of charge of the battery 205. Thus, the delay time period TD may be utilized to be long as it takes to detect said stable value of for the slope 450. FIG. 6B illustrates the determination of the value of the slope 450 during another time instance or another charging period TT during the same overall charging of the battery 205. The slopes 450 in FIGS. 6A and 6B are quite similar representing partially charged battery 205.

Figure 7:
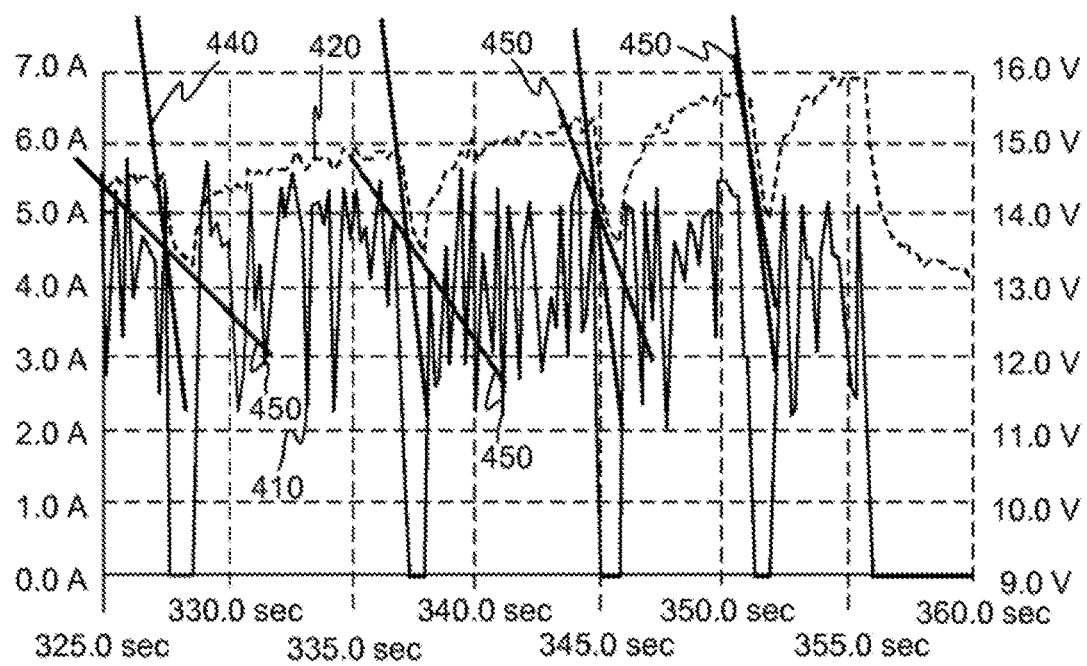
FIG. 7 illustrates the determination of the state of charge according to an embodiment of the present invention.

FIG. 7 illustrates measured charging current 410 and battery terminal voltage 420 during charging TT, and illustrates the determination of the state of charge of a battery 205 including the fully charged condition according to an embodiment of the present invention. As can be seen, the slopes 450 of the battery terminal voltage 420 shown in FIG. 7 determined during several consecutive interruption time periods T2 steepen with respect to each other when approaching the fully charged condition. The steepening nature of the slope 450 may be utilized for determining the state of charge of the battery 205. Once the battery 205 is fully charged, the effect of the capacitive element(s) on the voltage disappears and the abrupt change due to the resistive elements 440 is basically only detectable. This may be utilized for determining the state of charge of the battery 205 or at least when the battery 205 is fully charged.

When the battery gets fully charged there are no more ions available to transfer energy and store charge, that is, aspect related to the capacitive element(s) of the battery 205 as described hereinearlier. In practice, this doesn't happen instantaneously, but still quite fast, as it is seen that less and less ions are available when the battery gets nearer to full charge. As there are no ions available, the magnitude of the capacitive element(s) CIA, CI B, drastically reduces. The drastic reduction in the capacitive element(s) within 20 seconds can be seen FIG. 7 as the slope 450 rapidly steepens between consecutive charging periods.

According to various embodiments of the present invention, a value of the slope 450 may be compared to a threshold value for determining the state of charge, and/or when the battery 205 is fully charged.

As can be seen in FIGS. 6A, 6B and 7, the method according to an embodiment of the present invention may be utilized intermittently or continuously comprising consecutive charging periods TT in order to fully charge the battery 205.

According to various embodiment of the present invention, such as related to the method illustrated in and described with respect to FIG. 1, determination of a further voltage value at 610, that is, a third voltage value, may be performed, by for example a voltage measurement, right after the first time period T1 or even at the very end of the first time period T1. The third voltage value at 610 may be used as a reference value for determining if the battery is fully charged. This may be implemented, for example, by utilizing a condition: (voltage at 610–voltage at 460)< (voltage at 460–voltage at 470), then the battery is fully charged. The abovementioned condition may also be implemented as ratios by taking into account the time between different measurements, that is, actually defining the values for the slopes 440, 450. The abovementioned condition basically compares the voltage slope 440 in the beginning of the interruption period T2 to the voltage slope 450 later during the interruption period. As can be seen in FIG. 7, the slope 450 becomes as steep as the slope 440 when the battery is fully charged. A coefficient FF for calculation of the condition may also be used, for example, FF(voltage at 610–voltage at 460)<(voltage at 460–voltage at 470), therefore, enabling defining a less strict condition, for example, by using 0.90 or 0.95 as the coefficient FF.

Figure 8:
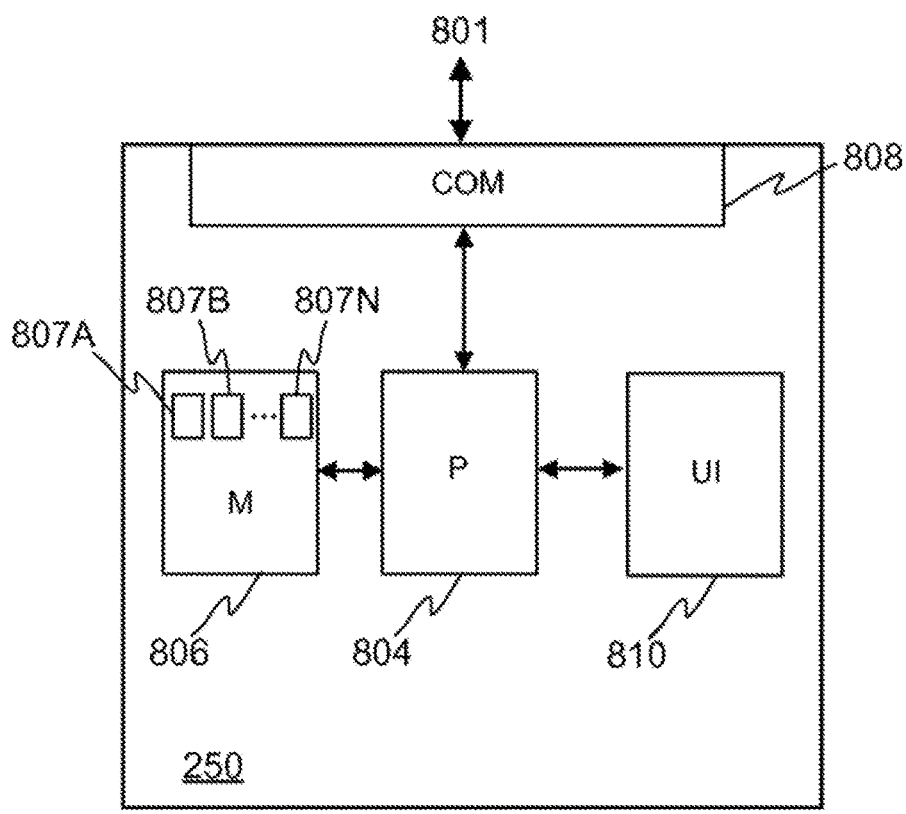
FIG. 8 illustrates a controlling unit according to an embodiment of the present invention.

FIG. 8 illustrates schematically a controlling unit 200 according to an embodiment of the present invention. External units 801 may be connected to a communication interface 808 of the controlling unit 200. External unit 801 may comprise wireless connection or a connection by a wired manner. The communication interface 808 provides interface for communication with external units 801, such as, an electrical converter 240, the battery 205, or determination means for determining voltage 260. There may also be connecting to the external system, such as a laptop or a handheld device. There may also be a connection to a database of the electronic charging arrangement 200 or an external database including information used in controlling the operation of the arrangement 200.

The controlling unit 200 may comprise one or more processors 804, one or more memories 806 being volatile or non-volatile for storing portions of computer program code 807A-807N and any data values and possibly one or more user interface units 810. The mentioned elements may be communicatively coupled to each other with e.g. an internal bus.

The processor 804 of the controlling unit 200 is at least configured to implement at least some method steps as described hereinearlier. The implementation of the method may be achieved by arranging the processor 804 to execute at least some portion of computer program code 807A-807N stored in the memory 806 causing the processor 804, and thus the controlling unit 200, to implement one or more method steps as described. The processor 804 is thus arranged to access the memory 806 and retrieve and store any information therefrom and thereto. For sake of clarity, the processor 804 herein refers to any unit suitable for processing information and control the operation of the electronic charging arrangement 200, among other tasks.

The operations may also be implemented with a microcontroller solution with embedded software. Similarly, the memory 806 is not limited to a certain type of memory only, but any memory type suitable for storing the described pieces of information may be applied in the context of the present invention.

The specific examples provided in the description given above should not be construed as limiting the applicability and/or the interpretation of the appended claims. Lists and groups of examples provided in the description given above are not exhaustive unless otherwise explicitly stated.

The invention claimed is:

1. A method for determining a state of charge of a battery during charging of the battery, wherein the method comprises:
    charging the battery with a charging current during a first time period;
    interrupting the charging current after the first time period at least for an interruption time period;
    determining a further voltage value at a third time instance in the end of the first time period or in the beginning of the interruption time period;
    determining a change of terminal voltage of the battery during the interruption time period between a first time instance and a second time instance;
    allowing the charging current to diminish during a delay time period after the first time period and prior to the determining the change of the terminal voltage; and
    determining a fully charged condition of the battery by comparing the determined change of terminal voltage to a change of voltage between the third time instance and the first time instance or the third time instance and the second time instance.

2. The method according to claim 1, wherein the charging includes charging the battery with a constant current.

3. The method according to claim 1, wherein the interrupting includes interrupting the charging current by opening a switch through which the charging current is injected into the battery via battery terminals for providing an open-circuit condition for the battery.

4. The method according to claim 3, wherein the switch is a semiconductor switch or a mechanical switch.

5. The method according to claim 1, wherein the determining of the change of terminal voltage includes measuring the terminal voltage at two time instances during the interruption time period, and determining the difference between the measured voltage values.

6. The method according to claim 1, wherein the determining of the state of charge includes comparing the determined change of the terminal voltage to a threshold value for the change of terminal voltage.

7. A controlling unit for determining a state-of-charge of a battery during charging, wherein the controlling unit comprises:
    a processors; and
    a memory storing at least one portion of computer program code configured to cause the controlling unit to:
        charge the battery with a charging current during a first time period,
        interrupt the charging current after the first time period at least for an interruption time period,
        determine a further voltage value at a third time instance in the end of the first time period or in the beginning of the interruption time period,
        determine a change of terminal voltage of the battery during the interruption time period between a first time instance and a second time instance,
        allow the charging current to diminish during a delay time period after the first time period and prior to the determining the change of the terminal voltage, and
        determine a fully charged condition of the battery by comparing the determined change of terminal voltage to a change of voltage between the third time instance and the first time instance or the third time instance and the second time instance.

8. An electronic charging arrangement for determining a state-of-charge of a battery during charging, comprising:
    charging means for charging the battery, wherein the charging means are electrically connected to battery terminals of the battery;
    determining means for determining a terminal voltage of the battery; and
    a controlling unit configured at least to,
        charge the battery with a charging current during a first time period,
        interrupt the charging current after the first time period at least for an interruption time period,
        determine a further voltage value at a third time instance in the end of the first time period or in the beginning of the interruption time period,
        determine a change of terminal voltage of the battery during the interruption time period between a first time instance and a second time instance,
        allow the charging current to diminish during a delay time period after the first time period and prior to the determining the change of the terminal voltage, and
        determine a fully charged condition of the battery by comparing the determined change of terminal voltage to a change of voltage between the third time instance and the first time instance or the third time instance and the second time instance.

9. The electronic charging arrangement of claim 8, wherein the controlling unit and the switch or the charging means are at least communicatively connected to each other.

10. The method of claim 1, wherein the interrupting includes interrupting the charging current by opening a switch through which the charging current is injected into the battery via battery terminals for providing an open-circuit condition for the battery.

* * * * *